(12) United States Patent
Ho et al.

(10) Patent No.: US 10,299,367 B2
(45) Date of Patent: May 21, 2019

(54) CIRCUIT BOARD HAVING CONDUCTIVE POLYMER

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Ming-Jaan Ho, Tu-Cheng (TW); Hsiao-Ting Hsu, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 34 days.

(21) Appl. No.: 15/716,541

(22) Filed: Sep. 27, 2017

(65) Prior Publication Data
US 2018/0070437 A1  Mar. 8, 2018

Related U.S. Application Data

(62) Division of application No. 15/273,730, filed on Sep. 23, 2016, now Pat. No. 9,807,868.

(30) Foreign Application Priority Data

May 17, 2016 (CN) .......................... 2016 1 0325604

(51) Int. Cl.
*H01B 1/22* (2006.01)
*H05K 1/02* (2006.01)
(Continued)

(52) U.S. Cl.
CPC ............ *H05K 1/0219* (2013.01); *C08F 12/22* (2013.01); *C08F 112/32* (2013.01); *C08K 3/28* (2013.01);
(Continued)

(58) Field of Classification Search
CPC .. C08F 112/32; C08F 12/22; C08K 2201/001; C08K 3/28; C09D 125/18;
(Continued)

(56) References Cited

U.S. PATENT DOCUMENTS

2004/0219377 A1* 11/2004 Kawaguchi ............. C23C 18/31
428/458

FOREIGN PATENT DOCUMENTS

CN          101308710 A     11/2008

OTHER PUBLICATIONS

"Effects of molecular weight on liquid-crystalline behavior of a mesogen-jacketed liquid crystal polymer synthesized by atom transfer radical polymerization", H.Zhang, et al. (Polymer) , vol. 43, issue No. 8, pp. 2357-2361.

* cited by examiner

*Primary Examiner* — Mark Kopec
*Assistant Examiner* — Jaison P Thomas
(74) *Attorney, Agent, or Firm* — ScienBiziP, P.C.

(57) ABSTRACT

A circuit board includes a flexible board, a composite film, and a copper layer. The composite film is formed on the flexible board and defines at least one through hole. The composite film includes a base layer having an active surface, and a conductive layer formed by coated a conductive polymer on the active surface. The conductive polymer is made by a mixture comprising liquid crystal monomers, a silver complex, an initiator, and a catalytic agent, and a solvent, the mixture is heated to undergo atom transfer radical polymerization. The copper layer covers the conductive layer and an inner wall of each of the at least one through hole. The copper layer is electrically connected to the flexible substrate by the through hole.

10 Claims, 8 Drawing Sheets

(51) Int. Cl.
  *C08F 112/32*  (2006.01)
  *C08K 3/28*   (2006.01)
  *C09D 5/24*   (2006.01)
  *C09D 125/18*  (2006.01)
  *H05K 1/09*   (2006.01)
  *H05K 1/11*   (2006.01)
  *C08F 12/22*  (2006.01)

(52) U.S. Cl.
  CPC .............. *C09D 5/24* (2013.01); *C09D 125/18* (2013.01); *H01B 1/22* (2013.01); *H05K 1/09* (2013.01); *H05K 1/115* (2013.01); *C08K 2201/001* (2013.01); *H05K 2201/0141* (2013.01); *H05K 2201/0215* (2013.01); *H05K 2201/0329* (2013.01); *H05K 2201/05* (2013.01)

(58) Field of Classification Search
  CPC .......... C09D 5/24; H01B 1/22; H05K 1/0219; H05K 1/09; H05K 1/115; H05K 2201/0141; H05K 2201/0215; H05K 2201/0329; H05K 2201/05
  See application file for complete search history.

CIRCUIT BOARD HAVING CONDUCTIVE POLYMER

CROSS-REFERENCE TO RELATED APPLICATIONS

This is a divisional application of patent application Ser. No. 15/273,730, filed on Sep. 23, 2016, entitled "METHOD FOR MAKING CONDUCTIVE POLYMER, AND COMPOSITE FILM AND CIRCUIT BOARD HAVING THE CONDUCTIVE POLYMER", assigned to the same assignee, which is based on and claims priority to Chinese Patent Application No. 201610325604.2 filed on May 17, 2016, the contents of which are incorporated by reference herein.

FIELD

The subject matter herein generally relates to a circuit board having a conductive polymer.

BACKGROUND

Circuit boards usually include electromagnetic shielding layers made of conductive or magnetic materials for blocking electromagnetic signals. One electromagnetic shielding layer may include an adhesive layer, a copper layer, and a solder mask layer. However, it is hard to electrically connect the copper layer to the solder mask layer using a chemical plating or electroplating process, and the copper layer connected thereto is easily peelable.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

An exemplary embodiment of a conductive polymer which can be used in a circuit board is described. The conductive polymer is made by heating a mixture comprising liquid crystal monomers, a silver complex, an initiator, and a catalytic agent, and a solvent, to cause the mixture to undergo an atom transfer radical polymerization (ATRP). The liquid crystal monomers have a mass percentage of about 42.2% to about 52.2% of a total mass of the mixture. The silver complex has a mass percentage of about 43.1% to about 53.1% of the total mass of the mixture. The initiator has a mass percentage of about 0.85% to about 1.35% of the total mass of the mixture. The catalytic agent has a mass percentage of about 2.85% to about 4.35% of the total mass of the mixture. The mixture and the solvent are in a ratio from 3:17 to 1:3 by weight. After the atom transfer radical polymerization, the silver complex is wrapped in the conductive polymer which causes the conductive polymer to be electrically conductive.

The liquid crystal monomers are selected from a group consisting of 2,5-bis[(4methoxyphenyl)oxycarbonyl]styrene (), 4-vinyl benzene and derivant thereof

R can be H, Me, t-Bu, Br, F, CF$_3$, or OAc), methyl acrylate hydroxyethyl acrylate vinyl acrylate

N,N-dimethylamino propenyl ketone acrylonitrile methyl methacrylate butyl methacrylate

N,N-dimethylaminoethyl methacrylate and tert-butyl methacrylate

In at least one exemplary embodiment, the liquid crystal monomers are 2,5-bis[(4methoxyphenyl) oxycarbonyl]styrene which can cause the conductive polymer to form side chains for wrapping the silver complex in the conductive polymer.

The silver complex can be selected from a group consisting of silver nitrate (AgNO$_3$), silver oxide (Ag$_2$O), AgBP$_4$, and AgPF$_6$. In at least one exemplary embodiment, the silver complex is silver nitrate.

The initiator can be selected from a group consisting of 1,3,5-(2'-bromo-2-methylpropionato) benzene

α-bromine ethane ( ),

2-ethyl bromide ( ), 2-bromine-2-methyl ethyl propionate ( ), and 2-dibromine propionitrile ( ).

In other exemplary embodiments, the initiator can be other halides such as other alkyl halides, benzyl halides, α-bromine compounds, α-haloketones, α-halogen halides, aryl sulfonyl chloride, or azobisisobutyronitrile. In at least one exemplary embodiment, the initiator is 1,3,5-(2'-bromo-2-methylpropionato) benzene which can cause the conductive polymer to form side chains for wrapping the silver complex in the conductive polymer.

The catalytic agent can be copper bromide (CuBr). In other exemplary embodiments, the catalytic agent can be copper bromide and sparteine.

The solvent can be selected from a group consisting of dimethyl sulfoxide (DMSO), dimethylformamide (DMF), and N-methyl-2-pyrrolidone (NMP). In at least one exemplary embodiment, the solvent is N-methyl-2-pyrrolidone.

An exemplary embodiment of a method for making the conductive polymer comprises the following steps. The liquid crystal monomers, the silver complex, the initiator, and the catalytic agent are mixed to form a mixture. The solvent is added into the mixture, and the mixture is heated to undergo atom transfer radical polymerization.

Figure 1:
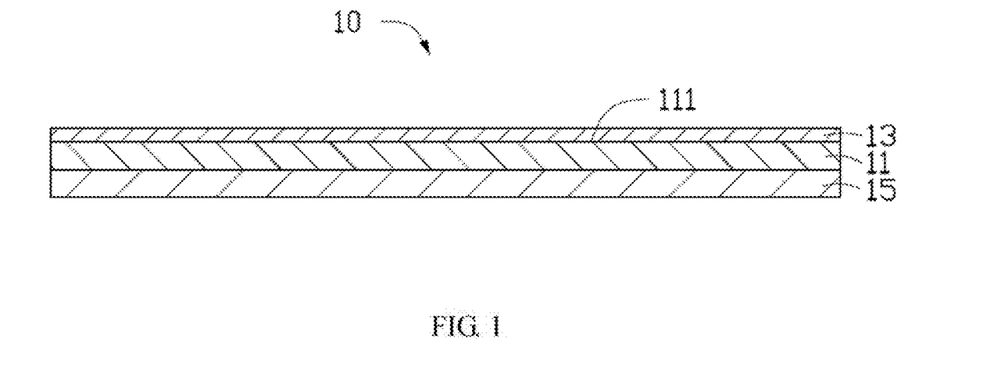
FIG. 1 is a diagrammatic view of an exemplary embodiment of a composite film according to the present disclosure.

FIG. 1 illustrates a composite film 10 comprising a base layer 11 made of liquid crystal polymer and a conductive layer 13. The base layer 11 comprises an active surface 111 treated by plasma activation. The conductive layer 13 is formed on the active surface 111 by coating the conductive polymer on the active surface 111. This causes the silver complex in the conductive polymer to be bonded to the active surface 111.

The composite film 10 can further comprise an adhesive layer 15 in contact with a surface of the base layer 11, which is opposite to the active surface 111.

Referring to FIGS. 1-6, each step of a method for making a circuit board 100 is presented in accordance with an exemplary embodiment. The exemplary method for making the circuit board 100 is provided by way of example, as there are a variety of ways to carry out the method. The exemplary method can begin at step 1.

At step 1, referring to FIG. 1, at least one composite film 10 is provided, which comprises the base layer 11 comprising the active surface 111, the conductive layer 13 formed on the active surface 111, and the adhesive layer 15 formed on the surface of the base layer 11 which is opposite to the active surface 111.

Figure 2:
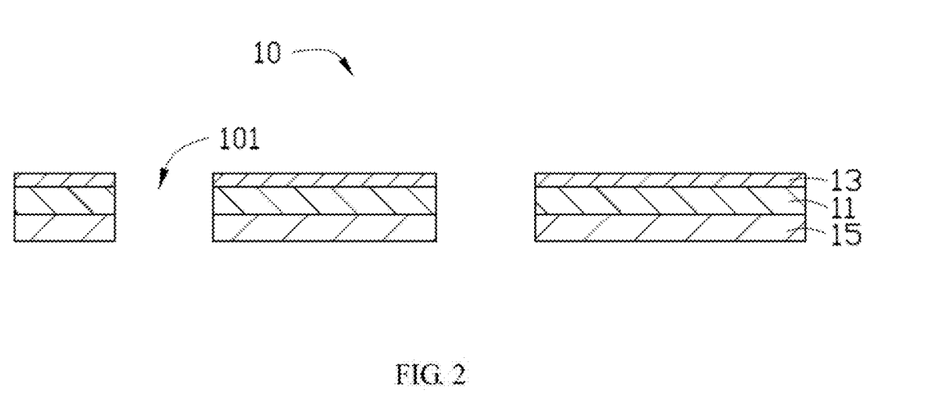
FIG. 2 is a diagrammatic view showing through holes defined in the composite film of FIG. 1.

At step 2, referring to FIG. 2, at least one through hole 101 is defined in the composite film 10 which goes through the adhesive layer 15, the base layer 11, and the conductive layer 13. In at least one exemplary embodiment, the through hole 101 is defined by punching or etching.

Figure 3:
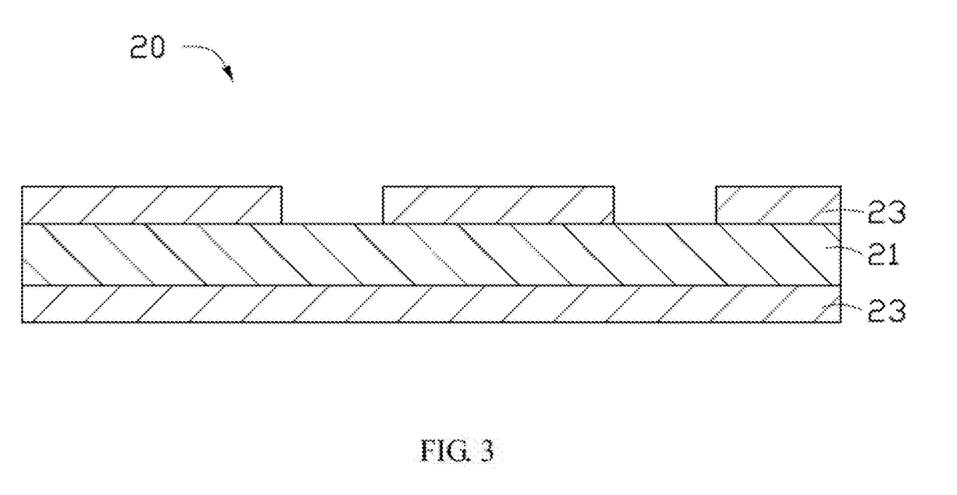
FIG. 3 is a diagrammatic view of a flexible board to support the composite film of FIG. 1.

At step 3, referring to FIG. 3, a flexible board 20 is provided, which comprises a substrate 21 and at least one conductive wiring layer 23 formed on one surface of the substrate 21. The flexible board 20 can be a single-sided board, a double-sided board, or a multiple-sided board. In at least one embodiment, the flexible board 20 is a double-sided board which comprises two conductive wiring layers 23 formed on opposite surfaces of the substrate 21.

Figure 4:
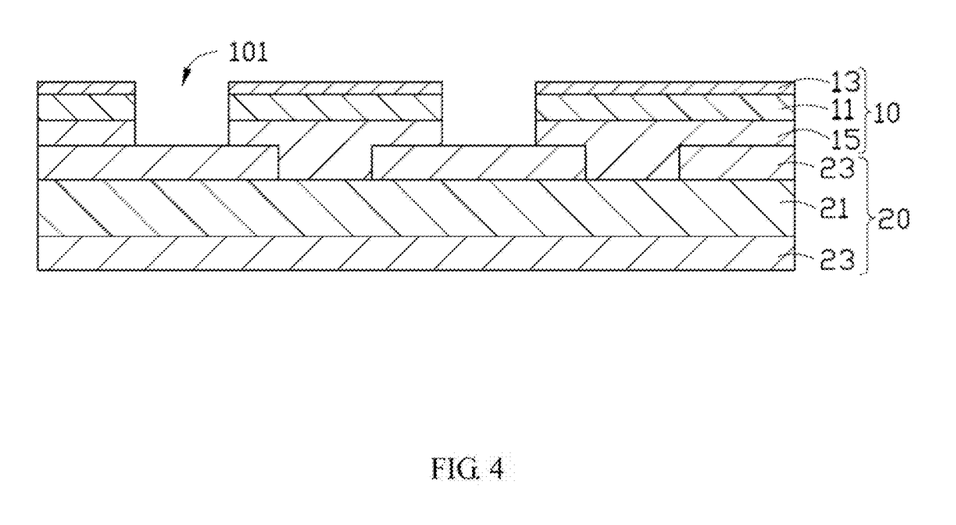
FIG. 4 is a diagrammatic view showing the flexible board of FIG. 3 being attached to the composite film of FIG. 2.

At step 4, referring to FIG. 4, the composite film 10 is attached to the flexible board 20 to cause at least one conductive wiring layer 23 to be formed on the adhesive layer 15.

Figure 5:
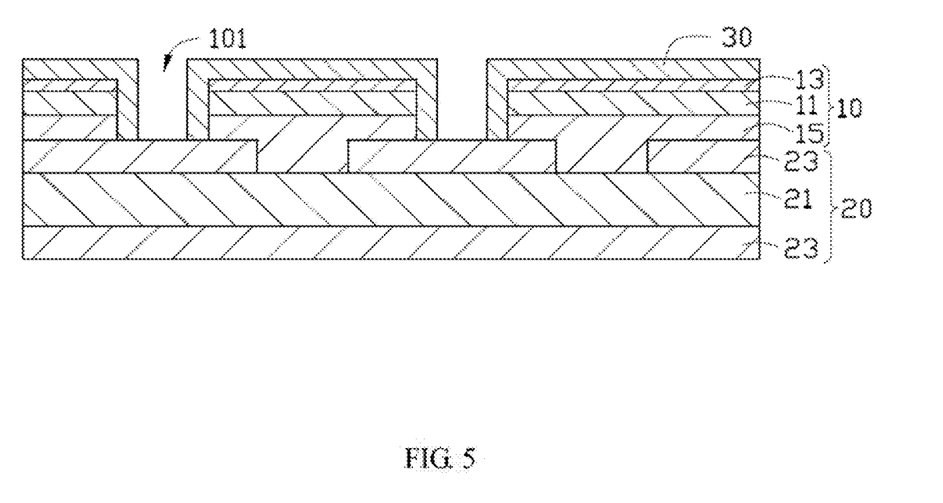
FIG. 5 is a diagrammatic view showing a copper layer formed on the composite film of FIG. 4.

At step 5, referring to FIG. 5, a copper layer 30 is formed on the conductive layer 13 to cause the copper layer 30 to further cover an inner wall of the through hole 101. Thereby, the conductive layer 13 is electrically connected to the conductive wiring layer 23 by the through hole 101. In at least one exemplary embodiment, the copper layer 30 can be formed by electroplating or chemical plating.

Figure 6:
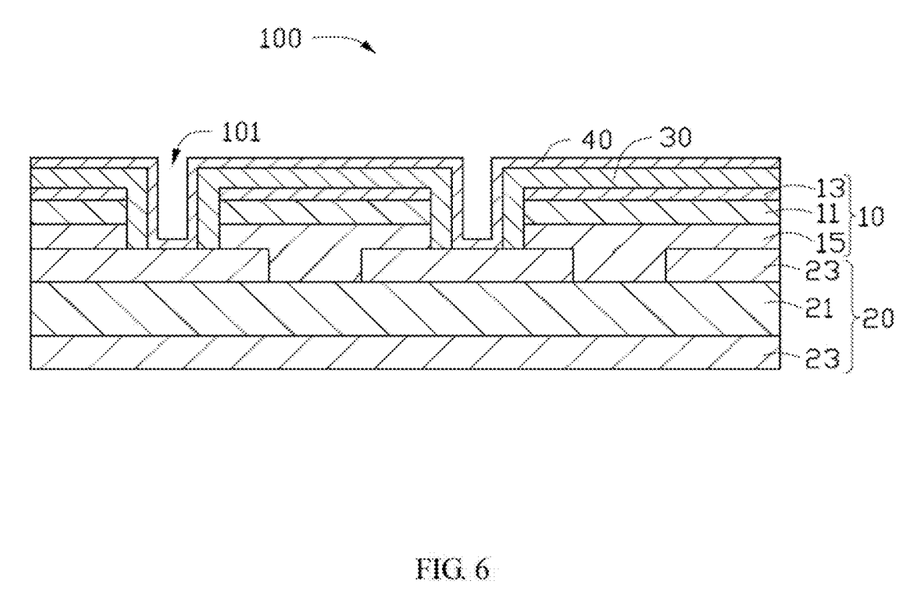
FIG. 6 is a diagrammatic view showing a solder mask layer formed on the copper layer of FIG. 5.

At step 6, referring to FIG. 6, a solder mask layer 40 is formed on the copper layer 30 to cause the solder mask layer 40 to further cover the inner wall and a bottom surface of the through hole 101.

FIG. 6 illustrates that the circuit board 100 comprises a flexible board 20, a composite film 10 formed on the flexible board 20, and a copper layer 30 formed on the composite film 10. The composite film 10 comprises the base layer 11 having the active surface 111, the conductive layer 13 formed on the active surface 111, and the adhesive layer 15 formed on the surface of the base layer 11 opposite to the active surface 111. The composite film 10 is formed on the flexible board 20 by the adhesive layer 15. The composite film 10 defines the at least one through hole 101 which goes through the adhesive layer 15, the base layer 11, and the conductive layer 13. The copper layer 30 covers the conductive layer 13 and the inner wall of the through hole 101, and is electrically connected to the flexible substrate 20 by the through hole 101.

In at least one exemplary embodiment, the flexible board 20 is a double-sided board which comprises the substrate 21 and two conductive wiring layers 23 formed on opposite surfaces of the substrate 21.

In at least one exemplary embodiment, the circuit board 100 further comprises the solder mask layer 40. The solder mask layer 40 covers the copper layer 30, the inner wall and the bottom surface of the through hole 101.

EXAMPLE 2,5-bis[(4methoxyphenyl)oxycarbonyl]styrene of 105.9 g, $AgNO_3$ of 108 g, 1,3,5-(2'-bromo-2-methylpropionato) benzene of 2.5 g, CuBr of 1.9 g, and sparteine of 6.1 g were mixed to form a mixture. 864 g of NMP was added into the mixture and heated under 90□ to form a conductive polymer. A composite film 10 was made by using the conductive polymer. A circuit board 100 was made by using a flexible board 20, the composite film 10, a copper layer 30, and a solder mask layer 40.

COMPARATIVE EXAMPLE

A circuit board was made by using a flexible board 20 and a conventional electromagnetic shielding layer. The electromagnetic shielding layer comprises an adhesive layer, a copper layer 30, and a solder mask layer 40. The adhesive layer has a thickness equaling that of the composite film 10 of the above example.

Figure 7A:
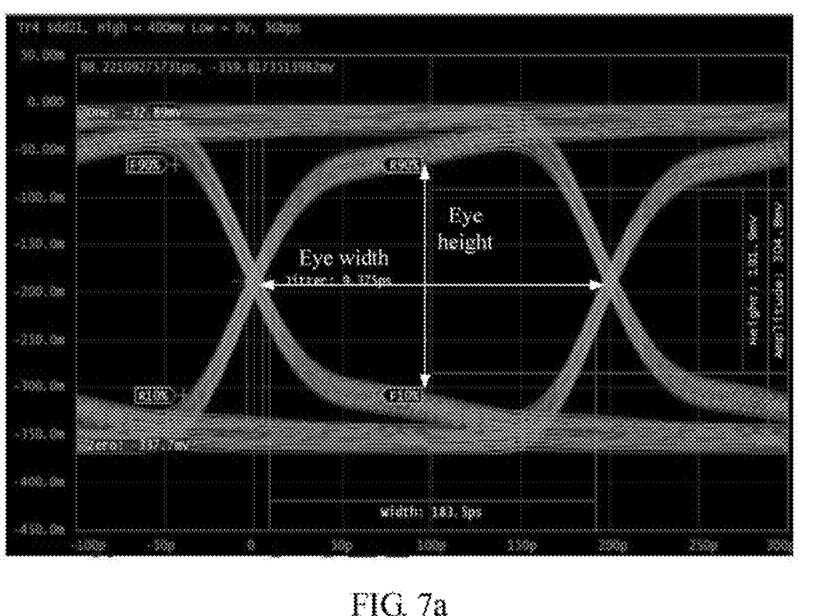
FIG. 7a is an eye pattern of a signal waveform from a circuit board of one exemplary embodiment, transmitting signals at 5 Gbps.
Figure 7B:
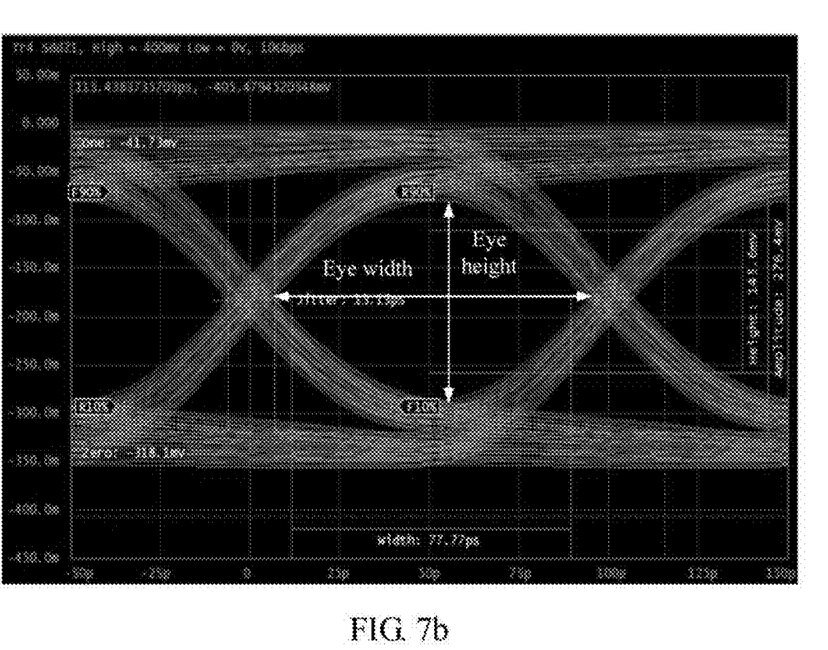
FIG. 7b is similar to FIG. 7a, but showing the circuit board transmitting signals at 10 Gbps.
Figure 8A:
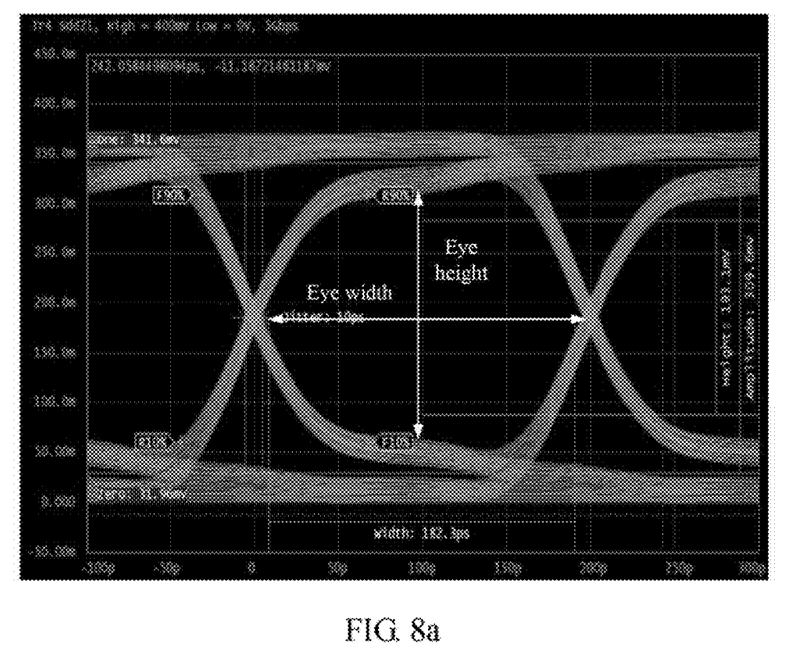
FIG. 8a is an eye pattern of a signal waveform from a circuit board of one comparative exemplary embodiment, transmitting signals at 5 Gbps.
Figure 8B:
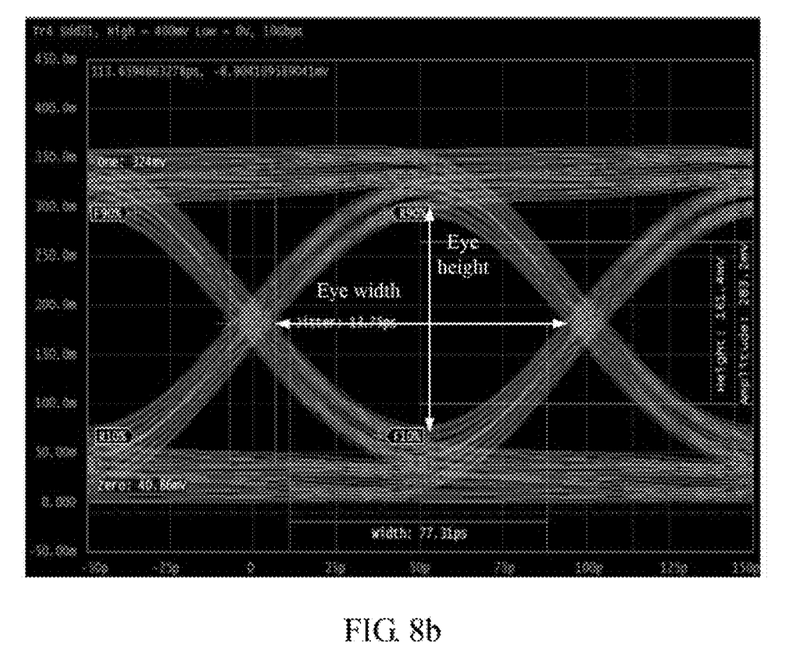
FIG. 8b is similar to FIG. 8a, but showing the circuit board transmitting signals at 10 Gbps.

The signal waveforms from the circuit board 100 of the example above for transmitting signals at 5 Gbps and 10 Gbps were tested to obtain the eye patterns shown in FIGS. 7a and 7b. The signal waveforms from the circuit board of the above comparative example for transmitting signals at 5 Gbps and 10 Gbps were also tested to obtain the eye patterns shown in FIGS. 8a and 8b. Comparing the circuit board of the examples, the circuit board 100 of the example above has an improved ability for blocking electromagnetic signals according to a comparison between eye heights and eye widths in the eye patterns.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
   a flexible board;
   a composite film formed on the flexible board and defining at least one through hole, the composite film comprising:
      a base layer having an active surface; and
      a conductive layer formed by coated a conductive polymer on the active surface, the conductive polymer made by a mixture comprising liquid crystal monomers, a silver complex, an initiator, and a catalytic agent, and a solvent, the mixture is heated to undergo atom transfer radical polymerization; and
   a copper layer covering the conductive layer and an inner wall of each of the at least one through hole, the copper layer electrically connected to the flexible substrate by the at least one through hole;
   wherein the liquid crystal monomers has a mass percentage of about 42.2% to about 52.2% of a total mass of the mixture, the silver complex has a mass percentage of about 43.1% to about 53.1% of the total mass of the mixture, the initiator has a mass percentage of about 0.85% to about 1.35% of the total mass of the mixture, the catalytic agent has a mass percentage of about 2.85% to about 4.35% of the total mass of the mixture, the mixture and the solvent has a ratio selected from 3:17 to 1:3 by weight, and the silver complex in the conductive polymer is bonded to the active surface.

2. The circuit board of claim 1, wherein the flexible board comprises a substrate and at least one conductive wiring layer formed on one surface of the substrate; and wherein the composite film is formed on the conductive wiring layer.

3. The circuit board of claim 1, further comprising a solder mask layer, wherein the solder mask layer is formed on the copper layer and further covers the inner wall and a bottom surface of each of the at least one through hole.

4. The circuit board of claim 1, wherein the at least one through hole is defined by one of punching and etching.

5. The circuit board of claim 1, wherein the liquid crystal monomers are selected from a group consisting of 2,5-bis [(4methoxyphenyl) oxycarbonyl]styrene, 4-vinyl benzene and derivant thereof, methyl acrylate, hydroxyethyl acrylate, vinyl acrylate, N,N-dimethylamino propenyl ketone, acrylonitrile, methyl methacrylate, butyl methacrylate, N,N-dimethylaminoethyl methacrylate, and tert-butyl methacrylate.

6. The circuit board of claim 1, wherein the silver complex is selected from a group consisting of $AgNO_3$, $Ag_2O$, $AgBP_4$, and $AgPF_6$.

7. The circuit board of claim 1, wherein the initiator is selected from a group consisting of 1,3,5-(2'-bromo-2-methylpropionato) benzene, α-bromine ethane, 2-ethyl bromide, 2-bromine-2-methyl ethyl propionate, and 2-dibromine propionitrile.

8. The circuit board of claim 1, wherein the catalytic agent is copper bromide.

9. The circuit board of claim 1, wherein the catalytic agent is copper bromide and sparteine.

10. The circuit board of claim 1, wherein the solvent is selected from a group consisting of dimethyl sulfoxide, dimethylformamide, and N-methyl-2-pyrrolidone.

* * * * *